United States Patent [19]

Matthew

[11] Patent Number: 4,817,193
[45] Date of Patent: Mar. 28, 1989

[54] AM TRANSMITTER HAVING SINGLE TUNING MEANS FOR OSCLLATOR, CARRIER ISOLATOR AND ANTENNA

[75] Inventor: Scott C. Matthew, Fond du Lac, Wis.
[73] Assignee: Realty Electronics, Inc., Fond du Lac, Wis.
[21] Appl. No.: 80,639
[22] Filed: Jul. 31, 1987
[51] Int. Cl.[4] ............... H03C 1/52; H01Q 11/12; H04B 1/04
[52] U.S. Cl. .................. 455/108; 455/120; 455/121; 455/125; 334/78; 334/83
[58] Field of Search .............. 334/1, 8, 77, 78, 83, 334/65, 108; 455/120, 121, 125, 66, 70, 57; 324/78 D

[56] References Cited

U.S. PATENT DOCUMENTS

| | | | |
|---|---|---|---|
| 2,498,078 | 2/1950 | Harrison | 455/120 |
| 2,894,208 | 7/1959 | Crow | 455/120 |
| 3,464,015 | 8/1969 | Brabham | 334/83 |
| 4,203,063 | 5/1980 | Loeb et al. | 324/78 D |
| 4,541,119 | 9/1985 | Cooper et al. | 455/18 |

Primary Examiner—John W. Caldwell, Sr.
Assistant Examiner—Tyrone Queen
Attorney, Agent, or Firm—Fuller, Puerner & Hohenfeldt

[57] ABSTRACT

A radio frequency transmitter, amplitude modulated, having a single tuner that tunes the frequency oscillator, the isolating filter and the antenna impedance, all at the same time. The transmitter includes a tunable carrier generator for generating a carrier signal of a desired frequency, and a carrier isolator for filtering the carrier signal so as to ensure a clean, isolated carrier signal. A power amplifier is included for amplifying the signal from the carrier isolator. The power amplifier has a certain output impedance. An antenna is connected for transmitting the amplified signal from the power amplifier. The antenna also has a certain impedance. The transmitter further includes an impedance matching device connected between the antenna and the power amplifier for matching the antenna impedance and the power amplifier impedance. Finally, a single control knob is provided for simultaneously controlling the tunable carrier generator, the carrier isolator and the impedance matching device. Thus, any particular setting of this control knob corresponds to a predetermined value of each of the tunable carrier generator, the carrier isolator and the impedance matching device.

9 Claims, 2 Drawing Sheets

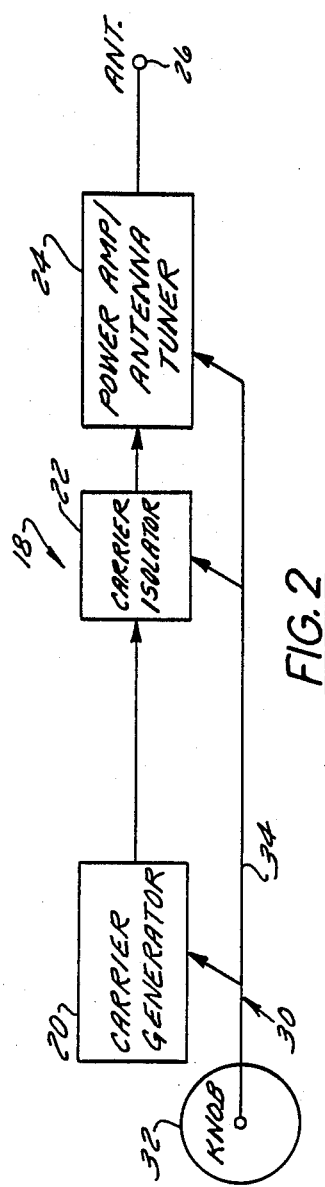
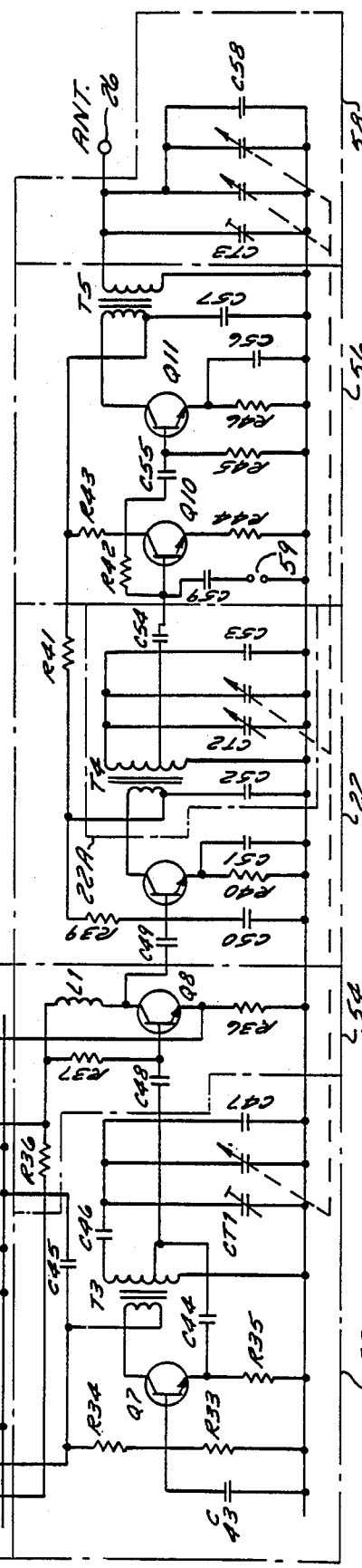
FIG. 2
FIG. 4

AM TRANSMITTER HAVING SINGLE TUNING MEANS FOR OSCILLATOR, CARRIER ISOLATOR AND ANTENNA

BACKGROUND OF THE INVENTION

This invention relates to radio frequency transmitters, and in particular to facilitated tuning mechanisms for low power amplitude modulated radio frequency transmitters for use in transmitting information over a relatively short distance.

Low power radio transmitters have found wide application in the transmission of information over short distances, that is, a few hundred feet or less. One particularly advantageous application of such a transmitter is in the field of real estate sales. As indicated generally in Cooper, U.S. Pat. No. 4,541,119, and as shown in FIG. 1 hereof, it is known to provide a tape player 10 having pre-recorded information about a particular property 11, located within the house or other building 12 situated on that property. A radio transmitter 13, usually AM, is connected to the tape player 10 for transmitting the information on the tape via the airwaves 13a. A sign 14, usually on a signpost 14a, is generally placed on the property 11 indicating, generally among other things, the frequency at which the information is being transmitted. These transmissions may then be received on a car radio located in a passing car 16. Hence the driver 16a and any passengers 16b in the car 16 may receive and listen to the information being transmitted from the tape player 10 in the house 12, simply by tuning their car radio to the frequency indicated on the sign 14.

As this technique has come into wider use, however, certain problems have arisen. In particular, several of these tape players and transmitters, in combination, may be placed in homes in the same neighborhood, if they would happen to go up for sale at times coincident with each other. Alternatively, there may be other reasons for such transmitters to be located in proximity to each other. For instance, if the transmitters are rented for use in publicizing garage and rummage sales, a number of transmitters may be used in general proximity to each other. This proximity may cause interference between the various messages being transmitted, or simply between the transmissions themselves, if all the transmitters were to be set to transmit at the same single frequency. To avoid this interference on any particular frequency, the frequency at which the transmitters transmit must be adjustable or tunable to a large number of different frequencies.

However, up to the present time, tunable AM transmitters have either been simple to use, with a resultant extreme decrease in broadcast efficiency and range, or they have been extremely complex, and generally not suitable for tuning to different frequencies by the average layman not having specialized knowledge. The Cooper patent mentioned above indicates the problems that can be encountered in trying to get the signal from the transmitter to the receiver, and the solution there proposed is to move the transmitter closer toward the street to improve reception in the receivers in passing cars. What is needed in the marketplace, however, is an inexpensive AM transmitter that is easily tunable to broadcast over a large range of frequencies, and over a relatively large distance, such as over 100 feet using the unlicensed Federal Communications Commission (FCC) limitation of low power, in the range of 100 milliwatts, and short antennas, without the necessity of extensive technical knowledge on the part of the operator.

This invention relates to improvements to the apparatus described above and solutions to the problems raised thereby.

SUMMARY OF THE INVENTION

The invention relates to a radio frequency transmitter, amplitude modulated, having a single tuning means that tunes the carrier generator, the carrier isolator and the antenna impedance, all at the same time. The invention includes a tunable carrier generator for generating a carrier signal of a desired frequency, and a carrier isolator for filtering the carrier signal so as to ensure a clean, isolated carrier signal. Power amplifier means are included for amplifying the signal from the carrier isolator. This power amplifier means has a certain output impedance. Of course, the transmitter must include an antenna means for transmitting the amplified signal from the power amplifier means, and this antenna also has a certain impedance. The invention further includes an impedance matching means connected between the antenna means and the power amplifier means for matching the antenna impedance and the power amplifier impedance with each other. Finally, a single control means is provided for simultaneously controlling the tunable carrier generator, the carrier isolator and the impedance matching means. Thus, any particular value or setting of this control means corresponds to a predetermined value of each of the tunable carrier generator, the carrier isolator and the impedance matching means, for maximum transmission efficiency, and therefore the greatest transmission range possible.

It is thus an object of the invention to provide an AM transmitter having a single tuning control for tuning the carrier generator and the carrier isolator and for matching the impedance of the antenna with that of the power amplifier.

Another object of the invention is to provide an AM transmitter as described above wherein the carrier generator includes a tunable oscillator for generating a tunable carrier signal, a fixed frequency oscillator for generating a signal having a fixed reference frequency, and mixing means for mixing together the tunable carrier signal and the fixed or reference signal and producing an output carrier signal of a desired frequency.

A more specific object of the invention is to provide an AM transmitter as set forth above including display means for displaying the actual frequency of the carrier signal.

Another specific object of the invention is to provide an AM transmitter as described above including a frequency counter for receiving the tunable carrier signal from the tunable oscillator and producing a signal relating to the frequency output of the mixing means, with this signal being transmitted to the frequency display means for displaying the chosen frequency.

Other objects and advantages of the invention will become apparent hereinafter.

DESCRIPTION OF THE DRAWING

FIG. 2 is a schematic view of a circuit constructed according to the invention.

FIG. 4 is a diagrammatic view of the circuit shown in FIG. 2 or FIG. 3.

DESCRIPTION OF THE PREFERRED EMBODIMENTS

Figure 1:
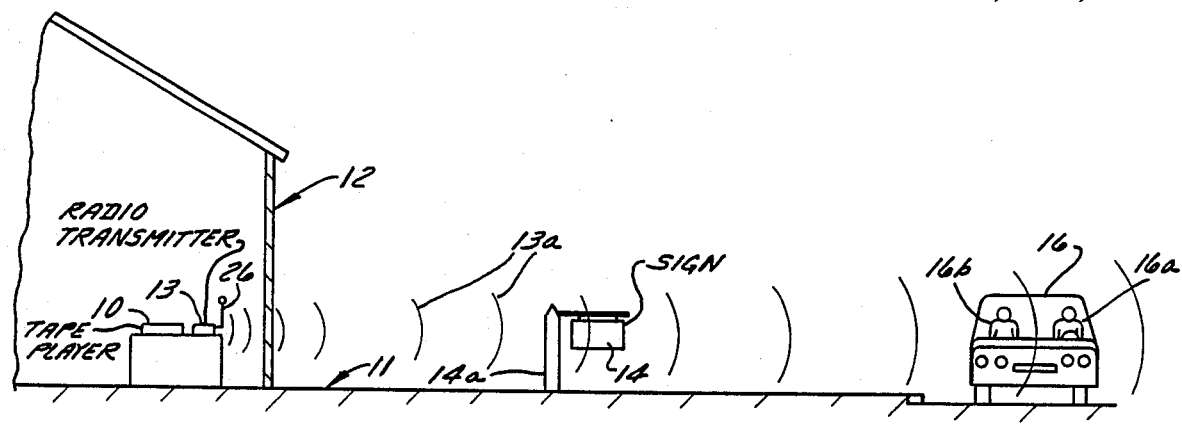
FIG. 1 is a plan view, partially in section, of a home having a device located therein which is constructed according to the invention.

Referring generally now to FIG. 2, an amplitude-modulated (AM) radio transmitter 18 as employed in the present invention includes a carrier generator 20 which generates a raw carrier signal and feeds it into a carrier isolator 22, for filtering the carrier signal so as to ensure that a clean, isolated carrier signal is provided. This isolated carrier signal is then provided to a power amplifier/antenna tuner circuit 24 and finally to an antenna 26 for radio frequency (RF) transmission. The purpose of the power amplifier/antenna tuner circuit 24 is both to increase the amplitude of the signal and to match the impedance of the antenna 26 to the impedance of the power amplifier 24. In certain known transmitters each of the major components, the oscillator, the carrier isolator and the amplifier/antenna tuner, is separately controllable and tunable by a separate control means. The conventional procedure required is to first tune the desired frequency, then tune the isolator so as to isolate that carrier frequency, and finally tune the antenna impedance for that frequency for maximum efficiency. In the present apparatus, however, according to the invention, all three components of the transmitter 18 are controlled by the same single control means 30, preferably a single tuner knob 32, connected to all three tunable components by any suitable connection means 34 such as a dial cord, or a shaft common to some or all of the components, or some combination of both.

Figure 3:
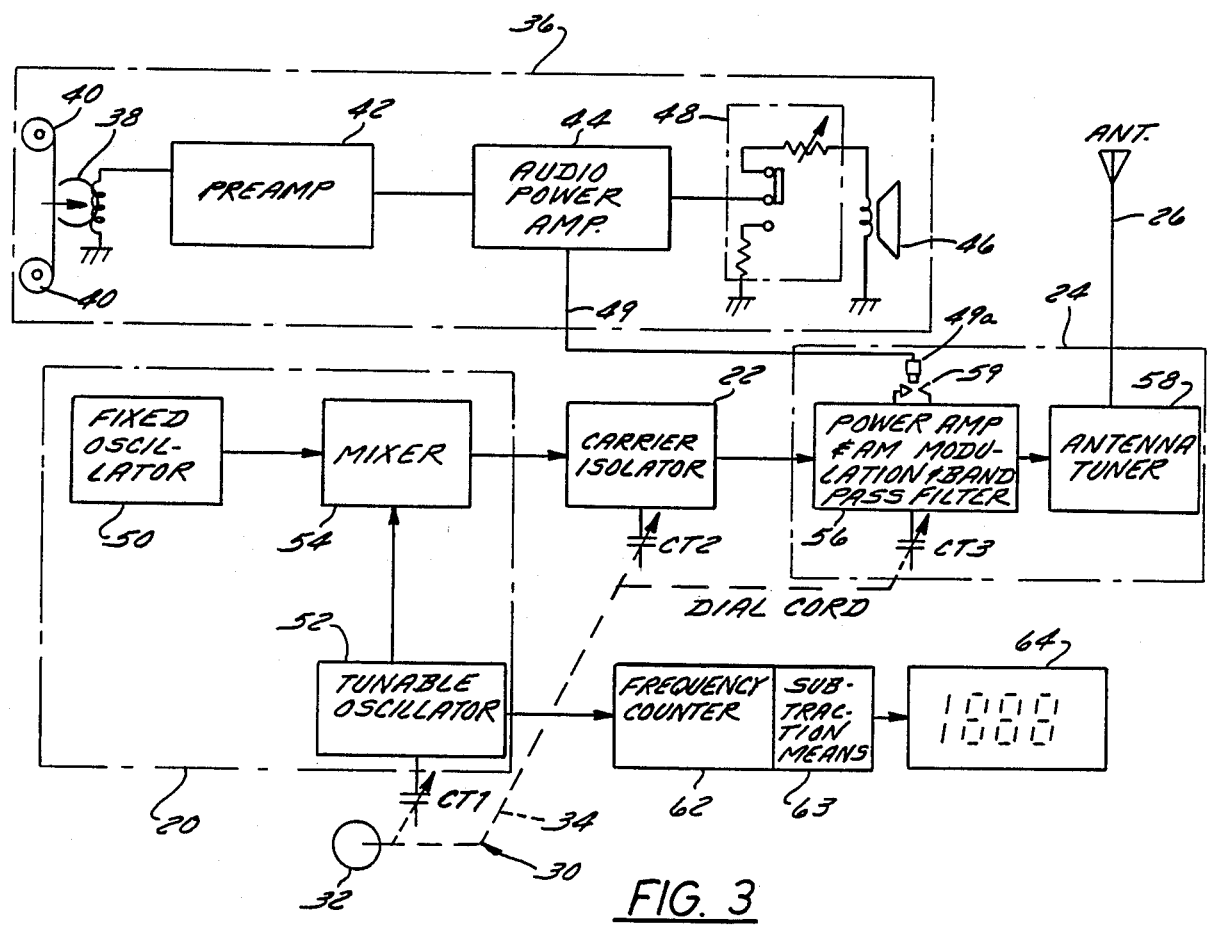
FIG. 3 is a more detailed schematic view of a circuit constructed according to the invention.

Referring now to FIG. 3, the circuit constructed according to the invention is shown in more detail and in combination with a tape player 36. The tape player 36 may be any suitable known tape player such as a cassette tape player. As shown in FIG. 3, the tape player 36 generally includes a tape head 38 for reading magnetic information from a tape 40 and converting it to corresponding electronic signals. These electronic signals are then processed and amplified in stages, in articular preamplifier 42 and tape power amplifier 44, before being sent to a speaker 46, to allow a user to listen to the information on the tape 40. A speaker switch 48 is usually provided between the speaker 46 and the power amplifier 44 to allow the user to control the volume and turn the power to the tape player 36 on and off. The electronic signal corresponding to the information on the tape 40 is also directed to the power amplifier 24 of the transmitter, as will be described below, by means of an audio output 49.

In the preferred embodiment, as shown schematically in FIG. 3 and diagrammatically in FIG. 4, the carrier generator 20 includes a fixed frequency oscillator 50, which generates just a single predetermined reference frequency, in this case 455 kHz, as determined mainly by the crystal CSB (FIG. 4). This oscillator provides the transmitter with a reference frequency to help avoid drift. The carrier generator 20 further includes a tunable oscillator 52, which can generate any frequency within a predetermined range, in this case between 975 and 2075 kHz. The actual frequency generated by tunable oscillator 52 is adjusted by tuning tunable capacitor CT1 (FIG. 4), interacting mainly with capacitors C46 and C47 and the output coil of isolation transformer T1. Finally, the signal from the fixed frequency oscillator 50 is subtracted from the signal generated by the tunable oscillator 52 in a mixer 54 to arrive at a carrier within the AM band, between 520 and 1620 kHz, as required by the FCC.

This carrier is then passed on to carrier isolator 22. Besides its main function of filtering the carrier by means of a band pass filter portion 22a (FIG. 4) so as to produce an isolated carrier, carrier isolator 22 also provides some preamplifying effect to the carrier signal. The band of frequencies affected by the band pass filter 22a is adjusted by tuning a tunable capacitor CT2 (FIG. 4), so as to eliminate any harmonics and other frequencies which may be present, and thus clean and isolate the carrier signal, limiting it to the single frequency desired.

As indicated above with respect to FIG. 2, once isolated, the carrier signal is passed on to power amplifier/antenna tuner circuit 24. In FIGS. 3 and 4 this circuit 24 is broken down into an amplifier/modulator 56 and an antenna tuning circuit 58. As indicated above, the amplifier/modulator 56 receives the isolated carrier signal from the carrier isolator 22 and combines it with the signal from the tape player 36 to produce a transmission signal. As shown in FIG. 3, the tape player 36 has an audio output 49, which connects to the modulation input port 59 (FIGS. 3 and 4) of the amplifier/modulator 56 by any suitable means such as a plug 49a. The transmission signal is then sent to the antenna 26 for transmission via the airwaves. However, since the antenna 26 has a certain impedance, and since the amplifier/modulator 56 has a certain impedance, each of which can vary depending upon the frequency of the carrier signal, it is important to match the impedances of the two components for greatest transmission efficiency. To this end, the antenna tuning circuit 58 is positioned between the amplifier/modulator 56 and the antenna 26. Thus by controlling tunable capacitor CT3 within antenna tuning circuit 58, these impedances are matched to attain the utmost efficiency of transmission, giving the greatest range within the FCC restrictions on length of antenna and transmitter power.

In order to provide the operator with an indication of the frequency at which the information is being transmitted, the circuit shown in FIG. 3 includes a frequency indication means 60. In the preferred embodiment, the frequency indication means 60 includes a frequency counter 62, preferably connected to the tunable oscillator 52, although it may also be connected to the output of the mixer 54. If connected to the tunable oscillator 52, the frequency counter 62 will include means 63 for subtracting the 455 kHz reference signal from the carrier generated, and send an appropriate signal to a display means 64, for displaying the frequency. Of course, if the frequency counter 62 is connected to the mixer 54 instead, no such subtracting means will be required.

While the apparatus hereinbefore described is effectively adapted to fulfill the aforesaid objects, it is to be understood that the invention is not intended to be limited to the particular preferred embodiments of AM transmitter having single tuning means for oscillator, amplifier and antenna as herein set forth. Rather, it is to be taken as including all reasonable equivalents without departing from the scope of the appended claims.

I claim:

1. A radio frequency transmitter, comprising:
    a tunable carrier generation means for generating a raw carrier signal of a desired frequency;

a carrier isolator means for filtering said carrier signal so as to produce an isolated carrier signal of said desired frequency, said carrier isolator means including a band pass filter for eliminating harmonics and other frequencies which may be present, said carrier isolator means being adjustable by means of a tunable capacitor positioned in said band pass filter;

power amplifier means for amplifying said isolated carrier signal from said carrier isolator means, and having a power amplifier impedance;

an antenna means for transmitting the amplified signal from said power amplifier means, and having an antenna impedance;

an adjustable impedance matching means connected between said antenna means and said power amplifier means for matching said antenna impedance and said power amplifier impedance together; and a single control means for simultaneously physically adjusting and controlling said tunable carrier generation means, said tunable capacitor of said carrier isolator means and said impedance matching means, such that any particular setting of said control means corresponds to a predetermined value of frequency for each of said tunable carrier generation means, said carrier isolator means and said impedance matching means.

2. A transmitter as recited in claim 1 further comprising:

input means for inputting an information signal to be transmitted;

modulation means for modulating said information signal with said isolated carrier signal of said desired frequency, to produce a modulated signal for output to said antenna means.

3. A transmitter as recited in claim 1 or claim 2 further comprising means for displaying the frequency of said raw carrier signal.

4. A transmitter as recited in claim 3 wherein said carrier generation means includes:

a tunable oscillator means for generating a tunable carrier signal;

a fixed frequency oscillator means for generating a fixed, reference carrier signal; and mixing means for mixing together said tunable carrier signal and said reference carrier signal and producing said raw carrier signal.

5. A transmitter as recited in claim 4 wherein said means for displaying said raw carrier signal frequency includes:

frequency counter means for receiving said tunable carrier signal from said tunable oscillator means and producing a frequency counter signal relating to the frequency of said raw carrier signal produced by said mixing means; and frequency indicating means connected to said frequency counter means for receiving said frequency counter signal and indicating the relevant frequency.

6. In combination with a tape player having a tape head for reading information from a pre-recorded tape and converting it to electronic signals and amplifying means for amplifying said electronic signals and producing an information signal, a radio frequency transmitter comprising:

a tunable carrier generation means for generating a raw carrier signal of a desired frequency;

a carrier isolator means for filtering said carrier signal so as to produce an isolated carrier signal of said desired frequency;

power amplifier means for amplifying said isolated carrier signal from said carrier isolator means, and having a power amplifier impedance;

an antenna means for transmitting the amplified signal from said power amplifier means, and having an antenna impedance;

modulation means for modulating said information signal with said amplified signal from said power amplifier means, to produce a modulated signal for output to said antenna means;

an impedance matching means connected between said antenna means and said power amplifier means for matching said antenna impedance and said power amplifier impedance together; and a single control means for simultaneously controlling said tunable carrier generation means, said carrier isolator means and said impedance matching means, such that any particular setting of said control means corresponds to a predetermined value of frequency for each of said tunable carrier generation means, said carrier isolator means and said impedance matching means.

7. A transmitter as recited in claim 6 further comprising means for displaying the frequency of said raw carrier signal.

8. A transmitter as recited in claim 7 wherein said carrier generation means includes:

a tunable oscillator means for generating a tunable carrier signal;

a fixed frequency oscillator means for generating a fixed, reference carrier signal; and mixing means for mixing together said tunable carrier signal and said reference carrier signal and producing said raw carrier signal.

9. A transmitter as recited in claim 8 wherein said means for displaying said raw carrier signal frequency includes:

frequency counter means for receiving said tunable carrier signal from said tunable oscillator means and producing a frequency counter signal relating to the frequency of said raw carrier signal produced by said mixing means; and frequency indicating means connected to said frequency counter means for receiving said frequency counter signal and indicating the relevant frequency.

* * * * *